United States Patent
Variyam et al.

(10) Patent No.: US 6,865,500 B1
(45) Date of Patent: Mar. 8, 2005

(54) METHOD FOR TESTING ANALOG CIRCUITS

(75) Inventors: Pramodchandran N. Variyam, Plano, TX (US); Abhijit Chatterjec, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/575,488

(22) Filed: May 19, 2000

Related U.S. Application Data

(60) Provisional application No. 60/134,800, filed on May 19, 1999.

(51) Int. Cl.$^7$ .............................................. G01R 31/316

(52) U.S. Cl. ..................... 702/117; 702/118; 324/765

(58) Field of Search ..................... 702/117–121, 123, 702/124, 126, 58, 59, 189, 112, FOR 103, FOR 104, FOR 139, FOR 170, FOR 171; 714/25, 30, 32, 33, 37, 724, 727, 728, 736, 752, 738–740, 718, 723; 324/500, 512, 765, 73.1; 365/201; 438/14, 17, 18; 716/1, 2, 4

(56) References Cited

U.S. PATENT DOCUMENTS

| | | | |
|---|---|---|---|
| 4,907,230 A | 3/1990 | Heller et al. ................ 371/22.1 |
| 4,935,877 A | 6/1990 | Koza ........................... 364/513 |
| 4,991,176 A * | 2/1991 | Dahbura et al. ............. 714/738 |
| 5,327,437 A | 7/1994 | Balzer ......................... 371/25 |
| 5,341,315 A * | 8/1994 | Niwa et al. ................... 714/738 |
| 5,506,852 A | 4/1996 | Chakradhar et al. .......... 371/27 |
| 5,748,647 A * | 5/1998 | Bhattacharya et al. ....... 714/726 |
| 5,805,795 A | 9/1998 | Whitten ................. 395/183.13 |
| 5,819,208 A | 10/1998 | Carter ......................... 702/182 |
| 5,859,962 A * | 1/1999 | Tipon et al. .................. 714/33 |
| 5,910,958 A * | 6/1999 | Jay et al. ..................... 714/738 |
| 6,070,258 A * | 5/2000 | Asaka ......................... 714/724 |
| 6,631,344 B1 * | 10/2003 | Kapur et al. .................. 703/22 |

* cited by examiner

*Primary Examiner*—Hal Wachsman
(74) *Attorney, Agent, or Firm*—Thomas, Kayden, Horstemeyer & Risley, L.L.P.

(57) ABSTRACT

The present disclosure relates to a method for testing a circuit having analog components. The method comprises performing a low-cost optimized test on the circuit by applying an optimized input stimulus to the circuit, capturing the circuit response to the input stimulus applied to the circuit, evaluating the circuit response to predict whether the performance parameters of the circuit satisfies predetermined specifications for the circuit, and making a pass/fail determination for the circuit based upon the evaluation of the circuit response.

16 Claims, 11 Drawing Sheets

Procedure OrderMeasurements
01 for each $i^{th}$ single ended specification
02   for each measurement
03     remove the measurement from the list of independent variables
04     derive the synthesizing function using MARS. Use the training set generated by GenerateTrainSet to train MARS
05     calculate the variance $\sigma^2_{ei}$
06   end for
07   order the measurement in the ascending order of $\sigma^2_{ei}$
08 end for Procedure SelectMeasurements
01 for each single ended specification
02   selected measurements = φ
03   repeat
04       add the measurement with lowest $\sigma^2_{ei}$ to the set of selected measurements use the ordered list of measurements generated by OrderMeasurements
05       derive the synthesizing function with the selected set of measurements
06       calculate the variance $\sigma^2_{ei}$
07   until $\sigma^2_{ei}$ starts increasing
08 end for

FIG. 8

METHOD FOR TESTING ANALOG CIRCUITS

CLAIM OF PRIORITY

This application claims priority to U.S. provisional application entitled, "Design of Alternate Tests to Replace the Specification Tests for Analog Circuits," having Ser. No. 60/134,800, filed May 19, 1999, which is entirely incorporated herein by reference.

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of Contract No. ARPA#9526-041 awarded by the DARPA of the U.S.

FIELD OF THE INVENTION

The present disclosure relates to a method for testing circuits. More particularly, the disclosure relates to a method of testing circuits having analog components, and a method of developing the tests applied to them.

BACKGROUND OF THE INVENTION

Currently, comprehensive and low-cost test methodologies for analog and mixed-signal systems analogous do not exist. Test methodologies for mixed-signal systems are based primarily on the paradigm of measuring the circuit's specifications to determine if they are "good" or "bad". This method is known as specification based testing. With this method of testing, each specification is measured for each circuit, e.g., an integrated circuit (IC), to ensure that the circuit satisfies all specified parameters.

Specification based testing has many drawbacks. Foremost perhaps is the cost associated with such testing. Testing costs include both the cost of test development as well as the costs associated with conducting the actual manufacturing tests. The cost factor becomes critical in high volume production of analog and mixed-signal ICs. Most of the previous research in test generation for fault detection in analog circuits assumes that a list of faults for which tests are to be generated is given. This approach is known as fault based testing. Realistic fault lists can be generated from analysis of the circuit layout using inductive fault analysis (IFA) based techniques.

In the past, test researchers have proposed eliminating some of the tests from the conventional specification test set to reduce production test cost. Theses researchers have been motivated by the fact that many of the specification tests contain redundant information about the underlying process defects. For instance, the correlation between specification tests has been used for test elimination. A more rigorous approach for test elimination based on QR factorization of linear models has also been proposed. During production testing, not only the number of tests but also the order in which they are performed affect the overall testing time and test quality. Thus, a further reduction in average production testing time can be achieved by performing those specification tests first, which take the least time and have the maximum fault coverage. A graphical theoretic approach has also been used to optimize specification tests. Although the tests derived using the above mentioned testing schemes can substitute for the conventional specification tests performed during the final test stage of analog circuits, these test methodologies again resort to costly (although optimized) specification tests for fault detection.

From the foregoing, it can be appreciated that it would be desirable to have a testing method for circuits, such as analog ICs, which accurately predicts circuit performance and which is low in cost to develop and perform.

SUMMARY OF THE INVENTION

The present disclosure relates to a method for testing a circuit having analog components. The method comprises performing a low-cost optimized test on the circuit by applying an optimized input stimulus to the circuit, capturing the circuit response to the input stimulus applied to the circuit, evaluating the circuit response to predict whether the performance parameters of the circuit satisfies predetermined specifications for the circuit, and making a pass/fail determination for the circuit based upon the evaluation of the circuit response.

In a preferred embodiment, the method deriving synthesizing functions which map measurement responses of the circuit to circuit performance parameters, applying an optimized input stimulus to the circuit, capturing the circuit response to the input stimulus applied to the circuit, evaluating the circuit response with respect to the derived synthesizing functions to predict whether a predetermined number of performance parameters of the circuit satisfies predetermined specifications for the circuit, making a pass/fail determination for the circuit based upon the evaluation of the circuit response, and for circuits for which a clear pass/fail determination cannot be made, performing specification based tests with respect to particular predetermined circuit specifications to make a final pass/fail determination for the circuit.

With these inventive methods, circuits such as analog ICs can be tested much more quickly and much more cheaply. The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

FIG. 8 is a is a schematic of a routine showing steps involved in synthesizing mapping functions.

DETAILED DESCRIPTION
Overview of the Test Methodology

Figure 1:
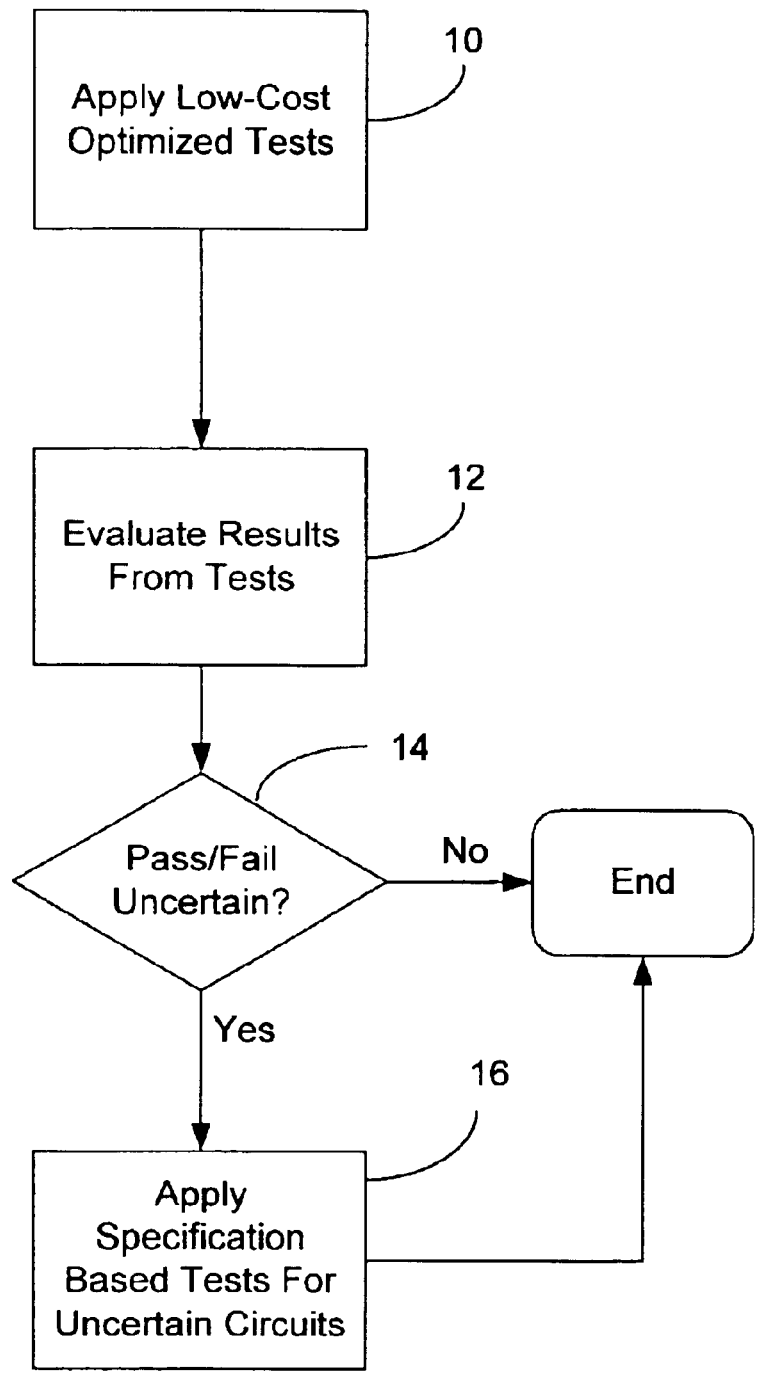
FIG. 1 is a high level flow diagram of a testing methodology in accordance with the present invention.

Referring now to the drawings in which like numerals identify corresponding components or steps, FIG. 1 illustrates a high level view of a testing methodology in accordance with the present invention. In an effort to reduce the cost of testing, the final test procedure can be divided into two stages. As shown in FIG. 1, the circuit under test (CUT) is first subjected to a set of low-cost optimized tests derived from the CUT's specifications, as indicated in block 10. These tests can be conducted by applying an input stimulus (described below) to the circuit and observing the response, e.g. in the form of a waveform, to determine whether the circuit operates in compliance with a majority of the specifications established for the circuit. Once these tests have been performed, the test results are evaluated, as shown in block 12, to determine whether the CUT passes with respect to the various predetermined specifications. At this point, it can be determined, at least with respect to some circuits, whether the circuit passes (is good) or fails (is bad).

Because of measurement errors, modeling errors, and mathematical residuals inherent to the test derivation process, the low-cost optimized tests which are the subject of the present disclosure may reject circuits that actually pass each designated specification or accept circuits which do not pass each designated specification. Therefore, at 14, some circuits may fall into a third category in which it is not clear from the optimized tests whether the circuit passes or fails. For these circuits, critical specification based tests can be applied in a second stage with respect to particular predetermined specifications in the conventional manner, as indicated in block 16, to ensure that each approved circuit complies with each specification. Determination of which specifications for a given circuit will be specification based tested can be made by, for instance, initially comparing the test results obtained for each specification with the low-cost optimized tests with conventional test results for each specification. In this manner, the accuracy of the low-cost optimized tests can be assessed on a specification-by-specification basis. Accordingly, the overall test process can comprise first applying the low-cost optimized tests to the CUTs, and then applying critical specification based tests to circuits which do not clearly pass or fail with respect to certain predetermined circuit specifications to make a final "good" or "bad" determination. With this methodology, the overall test cost is significantly smaller as compared to what would be incurred by applying specification based tests to every circuit with respect to each circuit specification.

Figure 2:
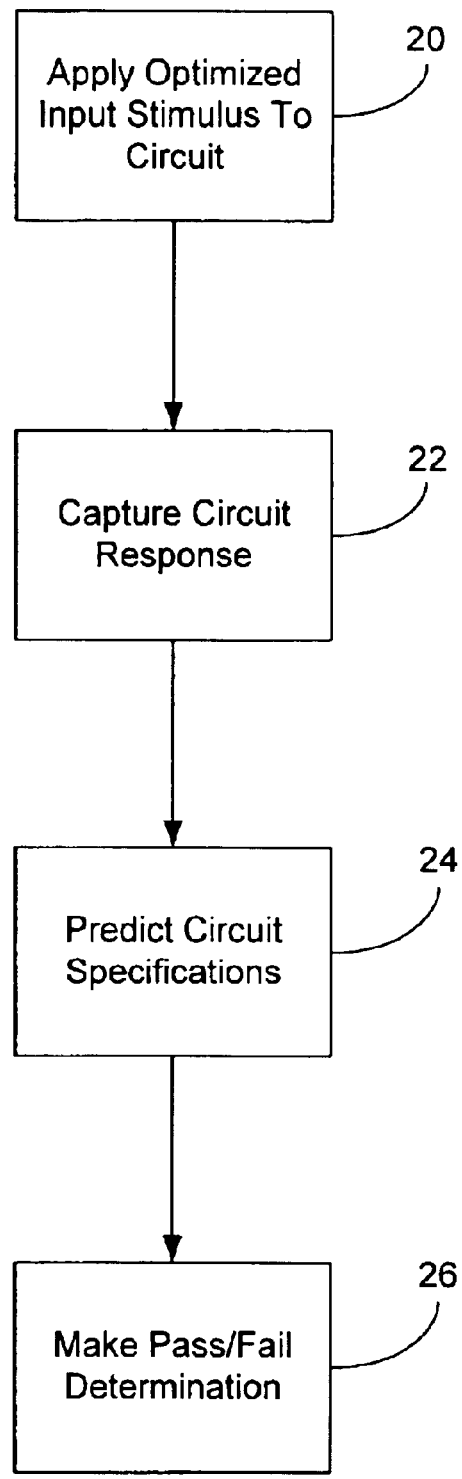
FIG. 2 is a flow diagram detailing a first portion of the testing methodology shown in FIG. 1.

FIG. 2 illustrates the first portion of the test method in greater detail. More particularly, this figure shows various steps involved in blocks 10 and 12 of FIG. 1. As shown in FIG. 2, the input stimulus is first applied to the circuit as indicated in block 20. Once this stimulus has been applied, the output response of the circuit can be captured (block 22) and, if desired, stored. From this response, the circuit specifications can be predicted, as indicated in block 24, so that pass/fail determinations can be made with regard to the predetermined specifications, as indicated in block 26.

Theoretical Background

Figure 3:
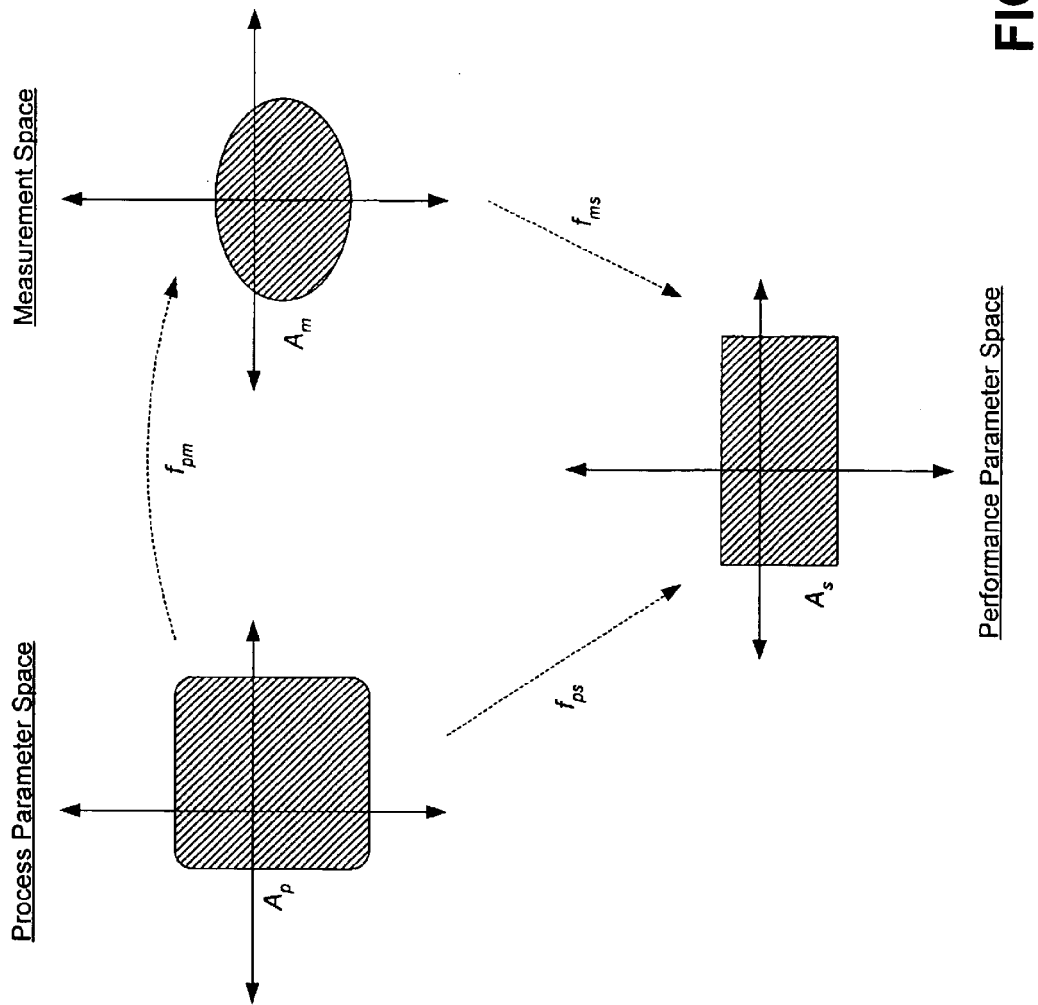
FIG. 3 is a schematic representation of various parameter spaces.

For a better understanding of the test generation methodology that follows, the theoretical background of the present invention is provided. The performance of a circuit, such as an analog IC, is determined by a set of associated process parameters, i.e., the parameters under which the circuit is constructed. For instance, such parameters can include the temperatures used during fabrication, the chemical compositions used, etc. These parameters can be denoted as $p=[p_1, p_2 \ldots, p_{np}]$, where $n_p$ is the total number of process parameters which affect the circuit performance. As identified in FIG. 3, a circuit fabricated in this process can be represented by a point in the $n_p$ dimensional process parameter space.

The design of an analog circuit is evaluated using various performance parameters which reflect the circuit's transient, frequency, and DC performance metrices. In other words, these performance parameters correspond to the specifications to which the circuit operates. The performance parameters can be denoted by $s=[s_1, s_2, \ldots, s_{ns}]$, where $n_s$ is the total number of performance parameters. Hence, a circuit can also be represented by a point in the $n_s$ dimensional performance parameter space. The performance parameters of a circuit can be related to the associated process parameters through a set of $n_s$ mapping functions denoted by $f_{ps}=[f_{ps1}, f_{ps2}, \ldots, f_{psns}]$. This is to say that the relation between the performance of the circuit and the processes used to manufacture the circuit can be defined as in equation [1].

$$f_{psi}p \rightarrow s_i,\ p\in\Re^{np},\ s_i\in\Re,\ i=1\ldots n_s \qquad \text{[Equation 1]}$$

As will be understood by persons having ordinary skill in the art, the performance parameters of the circuit are to satisfy certain specifications which are given by lower and/or upper bounds on the performance parameters. The specifications with a single bound can be designated as single ended specifications and those with both upper as well as lower bounds can be designated as double ended specifications. For the purposes of test generation, all the double ended specifications on the CUT can be decomposed into two single ended specifications, giving a total of $n_b$ single ended specifications (the subscript b standing for bound). Note that if there are $n_1$ performance parameters with single ended specifications and $n_2$ of them with double ended specifications, $n_1+n_2=n_s$ and $n_b=n_1+2n_2$. The lower or upper bound of the $i^{th}$ single ended specification can be denoted as $b_i$. The $i^{th}$ single ended specification (on the performance parameter $s_j$) defines a region $A_{s,i}$ in the $n_s$ dimensional performance parameter space containing all performance parameter values satisfying $$A_{s,i} = \left\{ s \in \Re^{n_s} \bigg|\begin{matrix}s_j>b_i \text{ if lower bound}\\ s_j<b_j \text{ if upper bound}\end{matrix}\right\}. \qquad \text{[Equation 2]}$$

Performance parameter sets satisfying all the $n_b$ single ended specifications form the acceptance region in the performance parameter space $(A_S)$ are defined by $$A_s = \bigcap_{i=1,\ldots,n_b} A_{s,i}. \qquad \text{[Equation 3]}$$

Circuits with performance parameters lying in this region are classified as fault free or good circuits while circuits with performance parameters outside this acceptance region are faulty or bad circuits. Since the performance parameter space and the process parameter space are related by the mappings given in equation [1], the acceptance region in the performance parameter space is implicitly related to the acceptance region in the process parameter space $(A_p)$ as defined by equations [4] and [5].

$$A_{p,i}=\{p\in\Re|f(p)\in A_{s,i}\} \qquad \text{[Equation 4]}$$

$$A_p = \bigcap_{i=1,\ldots,n_b} A_{p,i} \qquad \text{[Equation 5]}$$

One goal of the test generation method used herein is to find easy-to-perform measurements in which the CUT can be classified as good or bad. Assuming there are nm measurements represented by $m=[m_1, m_2, \ldots, m_{nm}]$, there is an $n_m$ dimensional measurement space in which the CUT can be represented by a point. These measurements are related to the process parameters of the circuit, with points in the process parameter space mapped onto the measurement space by $n_m$ mappings, $fpm=[f_{pm1}, f_{pm2}, \ldots f_{pmm}$ as defined in equation [6].

$$f_{pm_i}: p \to m_i, p \in \Re^{n_p}, m_i \in \Re, i=1 \ldots n_m \qquad \text{[Equation 6]}$$

Every circuit instance within the acceptance region in the process parameter space can be mapped into the measurement space using the mappings of equation [6] to give an acceptance region in the measurement space (Am) defined by equations [7] and [8].

$$A_{m,i} = \{m = f_{pm}(p) \in \Re^{nm} | p \in A_{p,i}\} \qquad \text{[Equation 7]}$$

$$A_m = \bigcap_{i=1,\ldots,n_b} A_{m,i} \qquad \text{[Equation 8]}$$

The functional mappings $f_{ps}$ and $f_{pm}$ are, in general, not available in closed form and these mappings are evaluated for a given p via numerical circuit simulation. According to rigorous mathematical definitions, the dimensions of the above mentioned spaces are equal to $n_p$, $n_s$, and $n_m$, conditional on the linear independence of the process parameters, performance parameters, and measurements respectively.

From the above discussion, it can be appreciated that the manufacturing parameters, performance parameters, and testing responses of a given circuit can be defined in terms of process parameter space, performance parameter space, and measurement space, and further that each of these spaces are related to each other. Just as a change in the parameter space, i.e., a fluctuation in a manufacturing parameter, will have an affect on the performance space, an input stimulus can be created which, when applied to a CUT manufactured with an incorrect process parameter, will yield a change in the measurement space which can be observed so that the defective nature of the circuit can be readily identified. As is discussed in greater detail below, one goal of the present method is to design tests which maximize the change in the measured response of the circuit so that defective circuits can more readily be identified.

Defining the Relationship Between Measured Response and Performance Parameters

Figure 4:
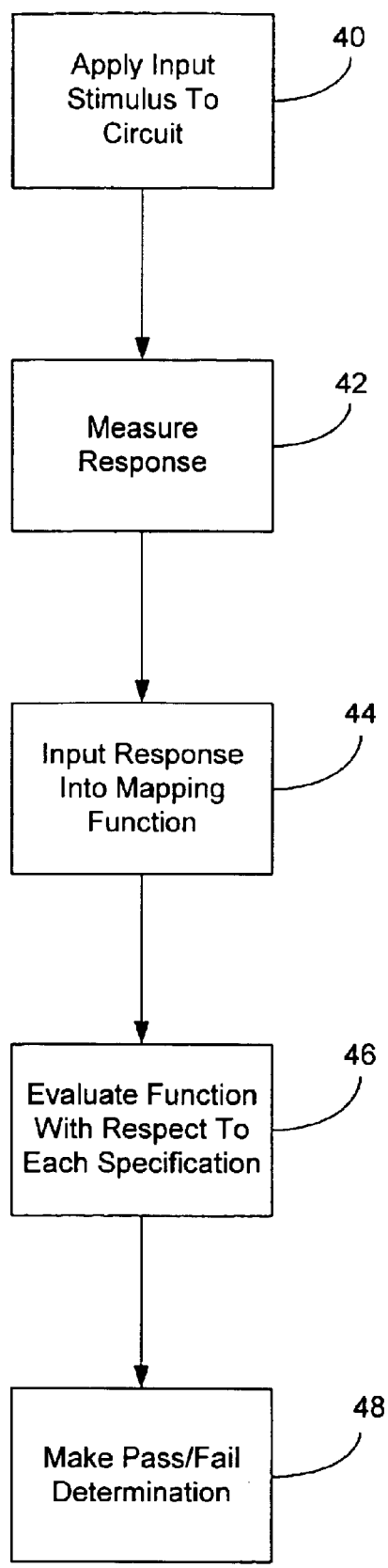
FIG. 4 is a flow diagram detailing the first portion of the testing methodology shown in FIG. 2.

From the foregoing discussion, it is apparent that, if the relationship between a measured response to an applied stimulus and the performance parameter of a circuit can be derived, the response can be used to predict compliance with the specifications. Thus, given a set of measurements obtained after applying the input stimulus, determining the test criteria involves finding the boundaries of the acceptance region in the measurement space. In other words, the relationship between the measured response and the various circuit specifications can be defined as a plurality of functions which map the measured response to each individual circuit specification. Once these mapping or synthesizing functions have been developed, the actual measured responses of a circuit to the input stimulus can be input into the mapping functions to make the pass/fail determination. Accordingly, the present testing method can further be represented as shown in FIG. 4. In this figure, the input stimulus is applied to the CUT at block 40. The response resulting from the application of the input stimulus is then measured, as indicated at block 42, and stored if desired. Once this measured response has been received, it can be input into the various mapping or synthesizing functions for the various circuit performance parameters (i.e., specifications) as indicated in block 44. The mapping functions can then be evaluated to determine whether the circuit satisfies each individual specification, as indicated in block 46, so that a pass/fail determination can be made, as indicated in block 48. At this point, flow can continue to specification based testing, if needed, as indicated in FIG. 2.

In a preferred arrangement, the measurements obtained from applying the test stimulus are post-processed to define the test thresholds on the post-processed data rather than the measurements themselves. This process can be designated measurement synthesis. The measurements are post-processed using a set of $n_b$ synthesizing functions ($f_{ms}=(f_{ms1}, f_{ms2}, \ldots, f_{msnb}]$) to yield $n_b$ synthesized measurements ($\theta=[\theta_1, \theta_2, \ldots, \theta_{nb}]$). This measurement synthesis can then be used to derive accurate test criteria for analog circuits.

Measurement synthesis involves deriving $n_b$ synthesized measurements from the $n_m$ original measurements using the $n_b$ synthesizing functions. All the information about the performance parameters of the circuit can be extracted using the synthesizing functions. As will be appreciated by persons having ordinary skill in the art, the synthesizing functions are preferably derived near the boundary of the acceptance region within performance parameter space to increase the accuracy of the functions in predicting a passing or failing performance parameter.

Suppose for a circuit instance p, the $j^{th}$ performance parameter is very near to the specification bound $b_i$, i.e., p is a critical circuit instance.

$$f_{psj}(p) \approx b_i \text{ for any } 0 < i \leq n_b \qquad \text{[Equation 9]}$$

Then the synthesizing function $f_{msi}$ for the specification bound $b_i$ need to be derived such that $$s_j = f_{psj}(p) = f_{pm}(p)) = \theta_i \qquad \text{[Equation 10]}$$

Figure 5:
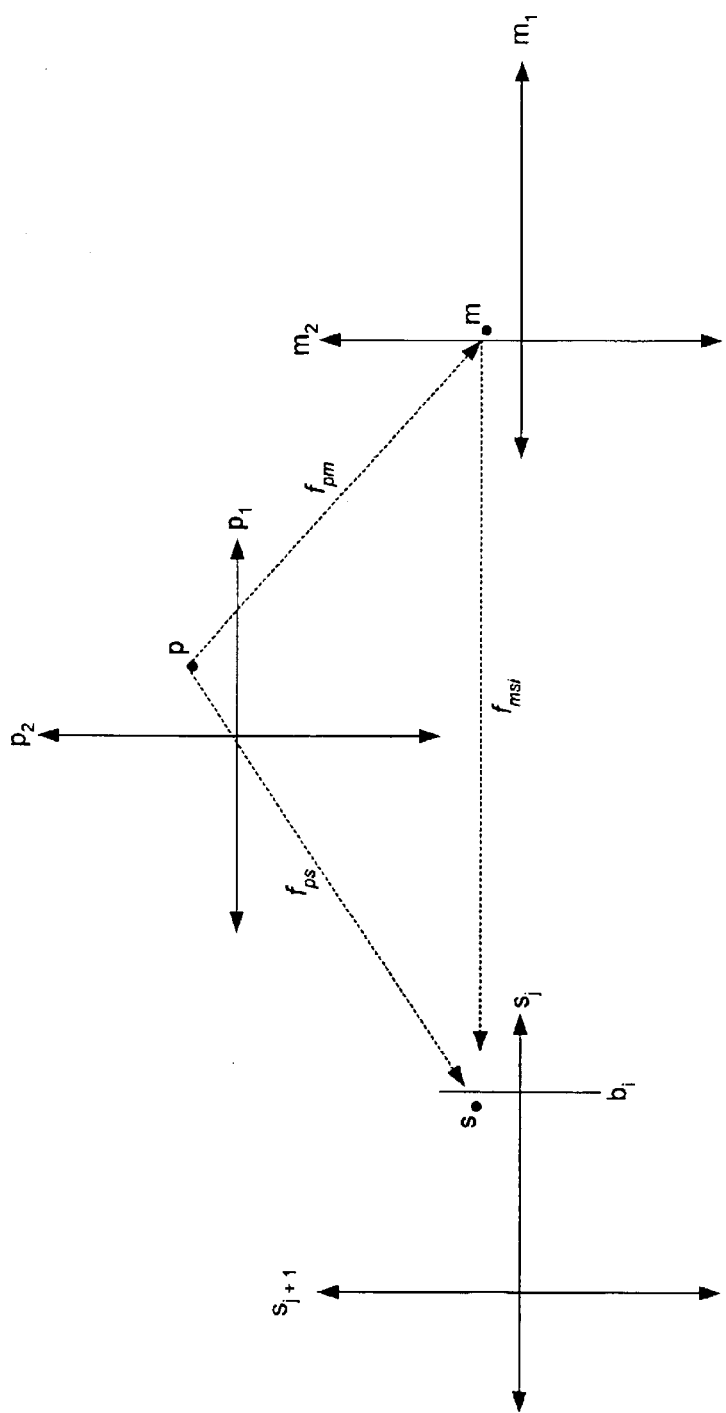
FIG. 5 is a schematic view of mapping between parameter spaces.

In order to understand the relation given in equation [10], consider FIG. 5. As illustrated in this figure, the circuit instance p is mapped to the performance parameter space and the performance parameter $s_j$ is very close to the specification bound by. Equation [10] requires that the $i^{th}$ synthesized measurement $f_{msi}(m)$ be equal to the $j^{th}$ performance parameter $S_j$. Notice that two different subscripts i and j are used since, as described above, a performance parameter can have a double ended specification on it. In that case, two synthesized measurements are derived, one tracking the performance parameter accurately near the upper bound and the other one tracking it accurately near the lower bound. Thus, if the post-processing function $f_{ms}$ satisfies the relation given in equation [10], then the synthesized measurements for the critical circuit instances become equal to the corresponding performance parameters. As a consequence, the specification bound $b_i$ itself becomes the test criteria for the $i^{th}$ synthesized measurement. Thus, the problem of accurate boundary determination can be converted to one of function approximation using measurement synthesis.

The aforementioned technique provides several advantages. First, since the synthesized measurements track the performance parameters, physically interpretable test criteria are obtained. Synthesized measurements contain much more information about the performance parameters than the measurements themselves, which is helpful for diagnostics. Second, there are robust nonlinear function approximation techniques which can be used to derive the synthesizing functions. Thus, the synthesizing functions can capture highly non-linear relations between measurements and performance parameters. For instance, as discussed below, a multivariate regression technique can be used to derive the synthesizing functions. Third, the misclassified circuits can be identified and handled systematically with this approach. For instance, as discussed below, various errors associated with the measurement synthesis can be incorporated to identify the circuits which are likely to be misclassified due to these errors.

Derivation of the Synthesizing Functions

The function $f_{ps}$, and $f_{pm}$, are very complex and are not available in closed form. Therefore, it is difficult to directly derive the synthesizing functions using equation [10]. However, function approximation using regression can be used. Ideally, the technique used for approximating the functional mapping between measurements and performance parameters should be able to approximate highly nonlinear functions accurately, should be able to handle large dimensionality of dependent variables, and should be immune to the problem of over-fitting. Multivariate Adaptive Regression Splines (MARS) is a known tool which has the above mentioned desirable properties. Hence, it can be desirable to use MARS to derive the post processing functions $f_{ms}$. One can also use neural networks or any other regression strategy to approximate the function $f_{ms}$. By way of example, the model produced by MARS can be of the form $$\hat{f}(\overline{x}) = a_0 + \sum_{m=1}^{M} a_m \cdot B_m^q(\overline{x}) \qquad \text{[Equation 11]}$$

where the coefficients $a_m$ are chosen to minimize the squared error of the regression model. $B_m(x)$ are splines of the form $$B_m^q(\overline{x}) = \prod_{k=1}^{K_n} H[s_{km} \cdot (x_{k,m} - t_{k,m})]^q \qquad \text{[Equation 12]}$$

where $s_{km}$ takes values ±1 and $$H[\eta] = \begin{cases} 1 & \text{if } \eta \geq 0 \\ 0 & \text{otherwise.} \end{cases} \qquad \text{[Equation 13]}$$

Each basis function is a truncated power spline basis function of desired order $q$. $x_{k,m}$ is one of the variables in x and $t_{k,m}$ is the knot location for the basis function. MARS modeling strategy is to progressively add basis functions based on the maximum reduction in the squared error of the model, until an over-fitted model is obtained. This basis set is then subjected to a backward stepwise deletion to produce the final model. While using measurement synthesis to determine test criteria, the chief source of misclassification of circuits are the inherent errors associated with regression and the non-idealities of the tester. As is discussed below, these non-idealities effect our test decision and how to identify circuits which needs to be tested further with the specification tests for fault detection.

As identified in the foregoing, errors associated with the measurement synthesis can increase the likelihood of mis-classifying circuits. Accordingly, it is advisable to take these errors into consideration when synthesizing the mapping functions. Due to the regression approximation the ideal synthesizing function $f_{msi}$ is related to the synthesizing function $f_{msi}$ obtained using MARS by equation [14], where $e_{ri}$ is the residual of regression.

$$s_j = f_{msi}(m) = \Re msi(m) + e_{ri} \qquad \text{[Equation 14]}$$

The residuals do not contain any information about the function that we are trying to approximate and they are usually modeled as normally distributed random variables with zero mean ($e_{ri} \sim N(0, \sigma_{eri}^2)$). The variance $\sigma_{eri}^2$, can be easily calculated from the training data without performing any additional circuit simulation.

To incorporate the effect of random measurement errors, the independent variables m in $\Re msi(m)$ can be replaced with $(m + e_m^*)$. The errors in measurement $(e_m^*)$ can be modeled as normally distributed random variables with zero mean and known covariance matrix $\Sigma_{em}(17)$.

$$e_m^* \sim N(0, \Sigma_{em}) \qquad \text{[Equation 15]}$$

For estimating the errors in the synthesized measurements, the way in which the statistical distribution of the measurement errors are altered by the synthesizing function ($\Re msi$) can be investigated. The random error in the synthesized measurement can be modeled as normally distributed with zero mean and variance $\sigma_{emi}^2$ which can be evaluated by simulation. It is to be noted that the variance can be estimated by evaluating the synthesizing function using a set of measurements with errors injected according to the measurement error statistics. This can be done without performing any additional circuit simulation. Thus, the following can be obtained $$\Re_{msi}(m + e_m^*) = \Re_{msi}(m) + e_{mi} \qquad \text{[Equation 16]}$$

where $e_{mi} \sim N(0, \sigma_{emi}^2)$. Substituting this expression with measurement errors incorporated, in equation [14] yields $$s_j \Re_{msi}(m) + e_{mi} + e_{ri} \qquad \text{[Equation 17]}$$

Assuming that the errors $e_{mi}$ and $e_{ri}$ are independent and normally distributed, equation [17] reduces to $$s_j \Re_{msi}(m) + e_i \qquad \text{[Equation 18]}$$

where $e_{mi} \sim N(0, \sigma_{ei}^2)$ and $$\sigma_{ei}^2 = \sigma_{emi}^2 = \sigma_{eri}^2 \qquad \text{[Equation 19]}$$

In equation [18], m is the actual measurements that we are making on the CUT for fault detection, $\Re msi(m) = \theta_i$ is the synthesized measurement. The random error, $e_i$, is the deviation of the synthesized measurement from the actual performance parameter $s_j$. Using the variance $\sigma_{ei}^2$, we can define a band $\delta_i$ around the specification bound $b_i$ as given as $$\delta_i = 3 \cdot \sigma_{ei} \qquad \text{[Equation 20]}$$

Figure 6:
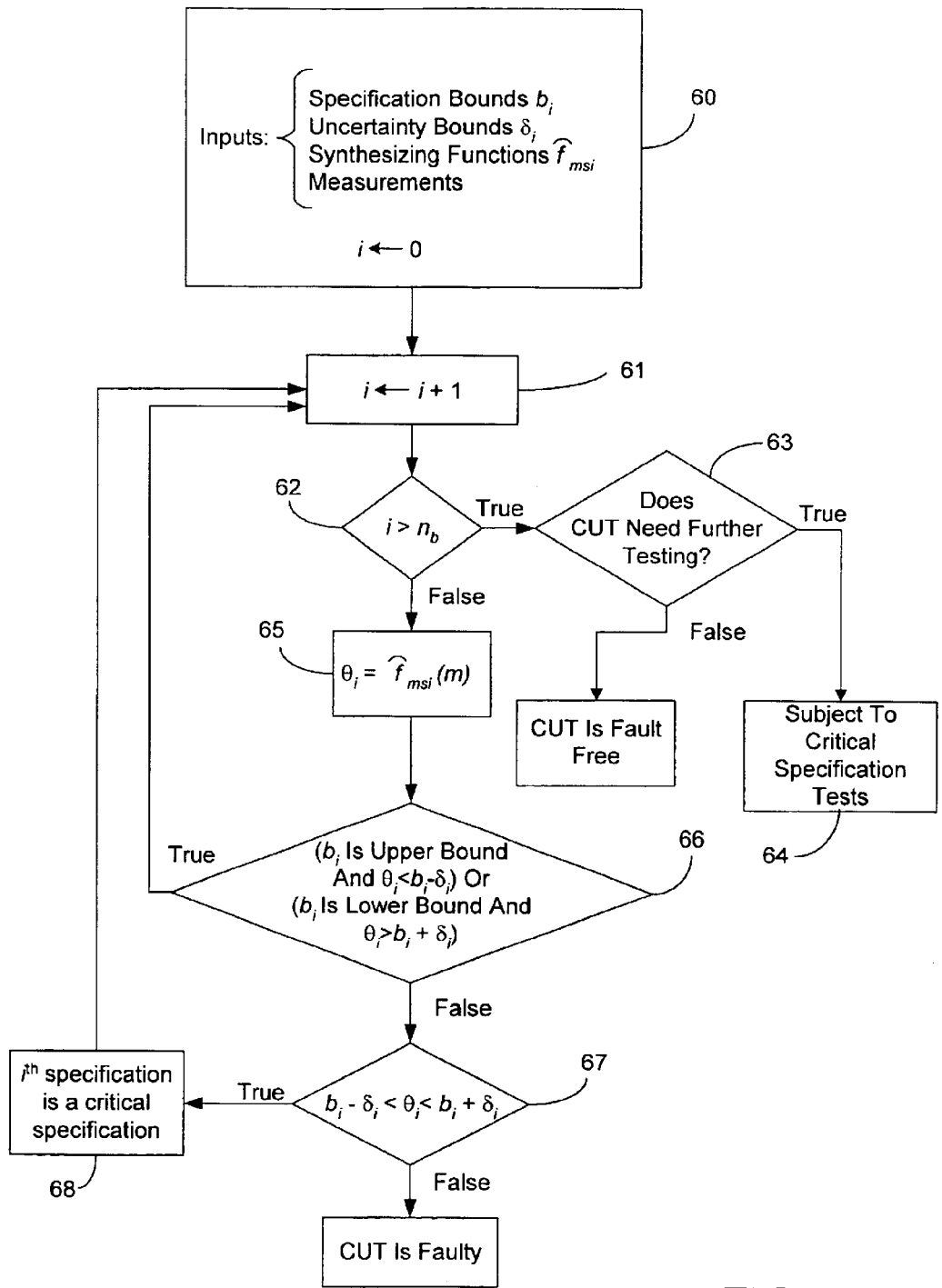
FIG. 6 is a flow diagram of an example test flow.

If the synthesized measurement $\theta_i$ of the CUT is within this band we cannot make a confident decision as to whether the CUT is good or bad by looking at the synthesized measurement. To decide if the CUT is good or bad we need to subject it to the $i^{th}$ specification test. Thus specification bound bi and the band δi constitutes the test criteria for the synthesized measurement $\theta_i$. FIG. 6 shows an example test flow diagram for production testing of analog ICs using measurement synthesis. With reference to block 60, given the acceptable ranges of all specifications, the measurement uncertainty due to inaccuracies in measurement instrumentation and modeling errors, and the mathematical prediction functions for predicting the circuit specifications form test response measurements, flow continues to block 61 in which it is determined whether the circuit needs further testing. If further testing is needed, specification tests can be conducted in block 64. If not all of the specifications have been computed, flow continues from 62 to block 65 in which, for a selected specification, the specification value is predicted from the response measurement. Next, at 66, it is determined whether the predicted value is such that it is certain that the circuits is good despite uncertainties. If not, flow continues back to block 61. If so, however, flow continues to 67 in which it is determined whether the predicted specification value is such that it is certain that the circuit is bad despite the uncertainty of $\delta_i$. If not, flow continues to block 68, and the specification value is very close to the boundary of acceptance for the specification. Flow then returns to block 61 where the process is repeated. From this flow diagram, it is clear that if any of the synthesized measurements declare the circuit as faulty, then at least one of the specification is violated and further testing is unnecessary. If all the synthesized measurements declare the circuit to be fault free then the CUT is good. If the circuit has a few critical specifications and is not faulty, then we need to subject the CUT to the critical specification tests to determine if the circuit is bad or good.

An objective during the test design and while deriving the synthesizing functions is to minimize the number of circuits which need further specification testing. This in turn can be achieved by minimizing the variance $\sigma_{ei}^2$. To minimize this variance, the individual variances of the two errors $e_{mi}$ and $e_{ri}$ can be minimized. The variance of the error due to regression can be minimized by appropriately selecting the training circuit instances for the MARS.

Figure 7:
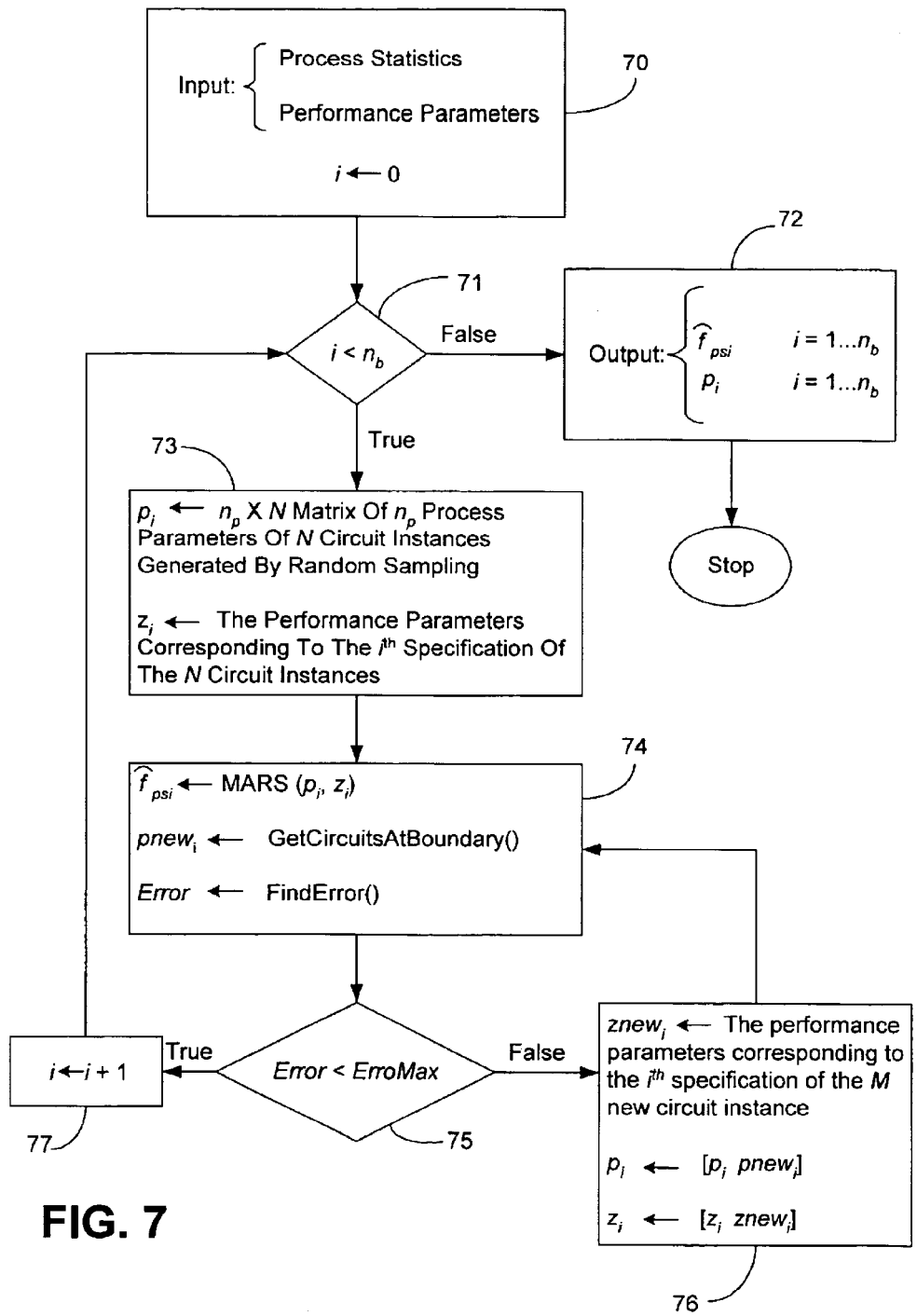
FIG. 7 is a flow diagram of generation of critical circuit instances.

For the synthesizing functions, measurements are the independent variables and the performance parameters are the dependent variables. A set of appropriate circuit instances in the process parameter space can therefore be selected and mapped to the performance parameter space and measurement space by circuit simulation. The accuracy of the generated MARS model depends heavily upon the circuit instances used for building the model. From equations [9] and [10] it can be understood that the synthesized measurements must track the corresponding performance parameters very well near the specification bound. Hence, to obtain a very accurate synthesizing function (low $\sigma_{eri}^2$) near the specification bound, the training set typically must contain a large number of circuit instances which lie close to these bounds (critical circuit instances). However, the boundary of the acceptance region in the process parameter space is not known a priori. One straight forward way of generating a critical circuit instances is to randomly select circuit instances in the process parameter space and simulate these circuits and see if the performance parameter is close to the specification bound. This will involve a large number of circuit simulations. Hence, the example procedure shown in FIG. 7 can be used to dynamically generate the critical circuit instances required for training. As shown in this figure, the process statistics and specifications can be input, as indicated in block 70. If all of the specifications have been considered (71), flow continues to block 72 where descriptions of circuits having specification values very close to the specification boundaries are generated. If, on the other hand, not all of the specifications have been considered, flow continues to block 73 in which sets of current descriptions with different process parameter values are randomly generated using the supplied process statistics. At block 74, a mathematical function of $\Re_{psi}$ is built which maps the random process parameter values to their respective specification values. This function can then be used to determine what the process parameters should be so that the circuit specifications will be close to or at the respective specification boundaries. Each set of process parameters thereby determine, by simulation, the corresponding specification values. If these values differ from the predicted values ($\Re_{psi}$) by less than a specified error (ErroMax) at 75, then flow continues to block 77 and the process is repeated. If not, however, flow continues to block 76 where, for newly generated circuits whose specifications do not lie close to the specification boundary, flow will continue back to block 74.

For each of the specifications one can start with a set of circuit instances generated by randomly sampling the process parameter space. Then a coarse MARS model is built relating the process parameters to the performance parameter of the CUT. This procedure takes this MARS model and finds a set critical circuits instances. This procedure uses binary search algorithm with the nominal circuit instance and a randomly selected circuit instance as the initial guesses to search for a critical circuit instance. Using these newly generated circuit instances, the average squared error between the performance parameters predicted and those obtained through simulation can be calculated. If this error is less than a predefined value, the existing MARS model is accurate near the specification bound, else more circuits are added to the training set to improve the model accuracy. The outputs of this routine are the MARS model relating the circuit performance parameters to the process parameters and a set of critical circuit instances.

For efficient production testing of analog circuits, it is desirable to minimize the number of measurements. By minimizing the number of measurements, the variance, $\sigma_{emi}^2$, is minimized. Moreover, the average production testing time is also minimized. Nevertheless, eliminating measurements might led to loss of information about the performance parameters of the circuit. This an increase in the variance $\sigma_{eri}^2$. Hence, only those measurements should be eliminated if used for deriving the synthesized tee measurements increases the overall variance $\sigma_{ei}^2$.

One straight forward method to extract the information content in all the measurements is principal component analysis (PCA). However, principal components of the measurement data are a linear combination of all the measurements itself. Hence PCA cannot be used directly for measurement selection. Therefore, a heuristic based on measurement ordering to select a set of measurements is used which will give a minimum variance $\sigma_{ei}^2$.

The procedure OrderMeasurements, shown in FIG. 8, removes one measurement at a time from the list of measurements and calculates the variance $\sigma_{ei}^2$ of the synthesizing function derived using the remaining measurements. The measurements are then ordered in the ascending order of the variance $\sigma_{ei}^2$. The procedure SelectMeasurements (FIG. 8) then takes this ordered list of measurements and adds one measurement at a time to the list of selected measurements and derives the synthesizing function using these selected measurements. Initially, the overall variance $\sigma_{emi}^2$ reduces because we increase the accuracy of our regression by adding more measurements. After adding a few measurements, the addition of more measurements do not result in an increase in the accuracy of the regression model. However, the variance $\sigma_{ei}^2$ increases because we are introducing more measurement error with the addition of a new measurement. This leads to an increase in the overall variance $\sigma_{ei}^2$. Once $\sigma_{ei}^2$ start increasing, we stop adding new measurements and the final list of measurements will give a minimum variance of the errors.

Test Stimulus Generation

The synthesis between measurements and performance having been desired in the foregoing, derivation of an optimized input stimulus will now be described. For DC and AC tests, the search space is small and a set of tests (input to SelectMeasurements( )) can be selected by uniformly sampling the range of possible DC input voltage and frequency of the sinusoidal test signal. However, for transient input stimulus the search space is very large. In searching for the best piece-wise linear (PWL) stimulus by dividing the time axis into $n_1$ divisions and voltage axis into $n_2$ divisions, there are $n_2^{n_1}$ possible solutions. For such problems, genetic algorithms have shown the ability to move towards better solutions by selecting possible solutions from a large search space. Hence, genetic algorithms can be used to search for the optimum PWL transient stimulus and sampling points.

Figure 9:
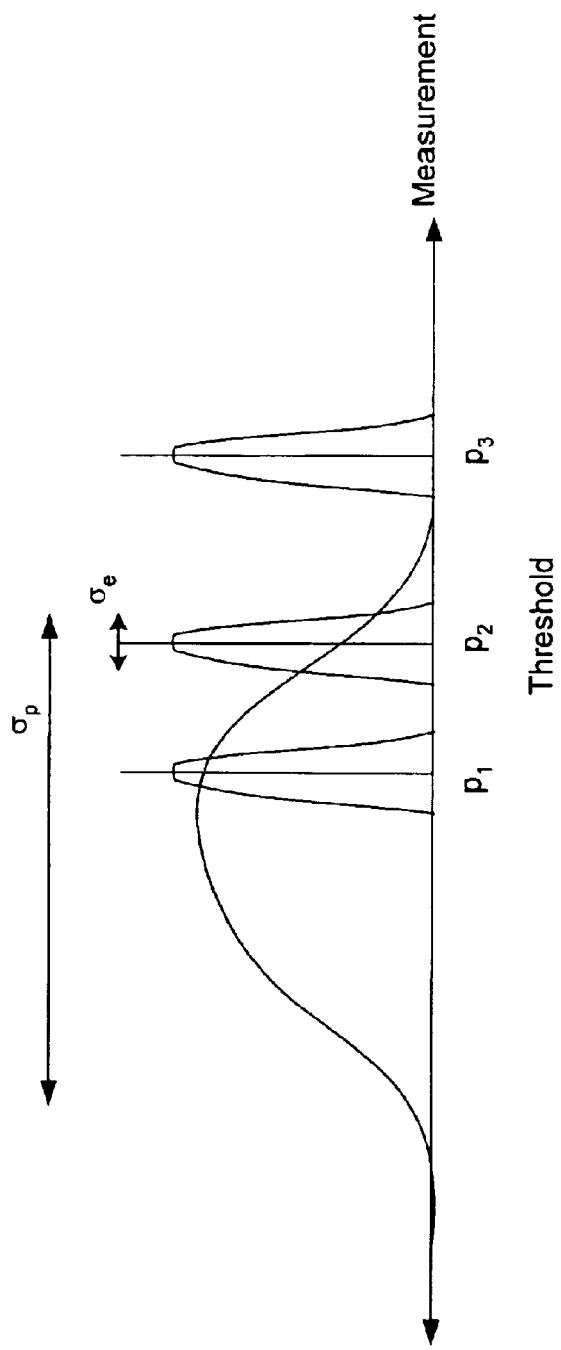
FIG. 9 is a graphical representation of standard deviation of measurements.

As explained above, the chief reasons for misclassification during testing are the measurement errors and regression errors. The problem of misclassification becomes severe near the boundaries of the acceptance region. This can be explained with the help of FIG. 9. In the figure, $\sigma_p$ is the standard deviation of the measurements around the nominal fault free circuit instance due to the process vaiations and $\sigma_e$ is that due to the measurement errors. Circuit instance $p_1$ is well within the region of acceptance, $p_3$ is outside the acceptance region and $p_2$ is at the measurement threshold. In the figure we show the distribution of the measurements performed on these circuit instances. From the figure it is clear that $p_1$ and $p_3$ are always classified correctly even in the presence of measurement errors. However, there is a high probability that, $p_2$, the circuit instance at the boundary of the acceptance region is misclassified. The chances of misclassification reduces if the ratio is $\sigma_p/\sigma_e$ increased. Thus a good test need to have the standard deviation due to the process variations much greater than that due to the measurements. An objective during test design is to increase the standard deviation $\sigma_p$ by appropriately choosing the measurements. This, in turn, can be achieved by selecting those measurements which are sensitive to the process parameter deviations of the circuit.

Figure 10:
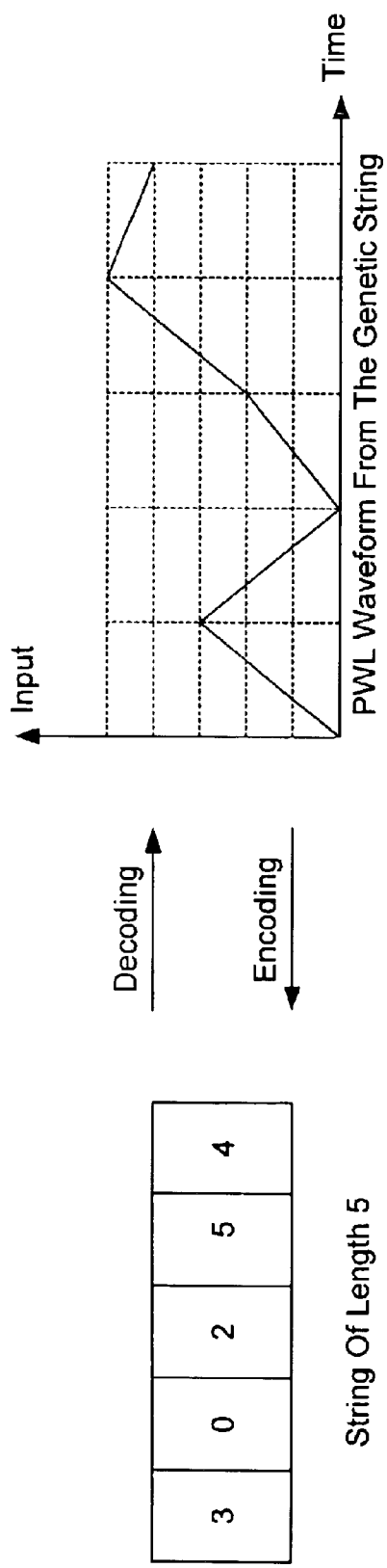
FIG. 10 is a schematic representation of string encoding.

Earlier sensitivity based test generation methods were formulated to maximize the sensitivity of the measurements to the process parameter variations of the nominal circuit instance. Maximizing the sensitivity of the measurements to the process parameter deviations around the nominal fault free circuit often does not help, especially for circuits with loose specifications. If the specifications are not tight, increasing the sensitivity of the measurements to the process parameters for the nominal circuit will not necessarily increase the sensitivity of the measurements to the process parameters for the circuit instances near the boundary. This will lead to large rates of misclassification for a drifted manufacturing process. Thus our objective during test generation is to derive measurements which are highly sensitive to the process deviations of the critical circuit instances. Thus the fitness function for a set of $n_m$ measurements is given by equation [23], where $n_c$ is the number of critical circuit instances. We select one worst-case circuit instance per single-ended specification to evaluate the fitness. This worst-case critical circuit instance is the one which is nearest to the nominal circuit instance (lowest $I_2$ norm) among all those generated by GenerateTrainSet( )

$$\text{Fitness} = \sum_{j=1}^{n_m} \sum_{i=1}^{n_p} \sum_{k=1}^{n_c} |(S_{p_i}^{m_j})_k| \qquad \text{[Equation 21]}$$

based on their fitness. After crossover and mutation of the existing population, the evolved new population again undergoes selection, crossover and mutation to give a population with individuals having better fitness functions. To conduct the genetic search, the search space typically must be encoded into genetic strings or chromosomes a set of rules must be provided for selection, crossover, mutation and fitness evaluation for these genetic strings. For example, the following rules could be established:

String encoding: The $i^{th}$ gene of the genetic string is an integer representing the voltage at time point $t_i$ (equation [22]). Thus, if the $i^{th}$ gene has a value j, the corresponding voltage of the PWL transient waveform is given by equation [23]. The string length of the population is equal to the total number of time divisions $n_t$. FIG. 10 shows the encoding in detail. In the figure, maximum voltage was assumed to be 5V and there are 5 voltage divisions and 5 time divisions.

$$t_i = \frac{t_{max}}{n_t} i \qquad \text{[Equation 22]}$$

$$Vin(t_i) = \frac{Vin_{max}}{n_v} j \qquad \text{[Equation 23]}$$

Selection: The selection of strings for crossover is biased towards strings having the highest fitness value so that the average fitness of successive populations tends to increase. Tournament selection can be used for selecting the parents for reproduction. Tournament selection involves picking two strings from the population and selecting the better for reproduction.

Figure 11:
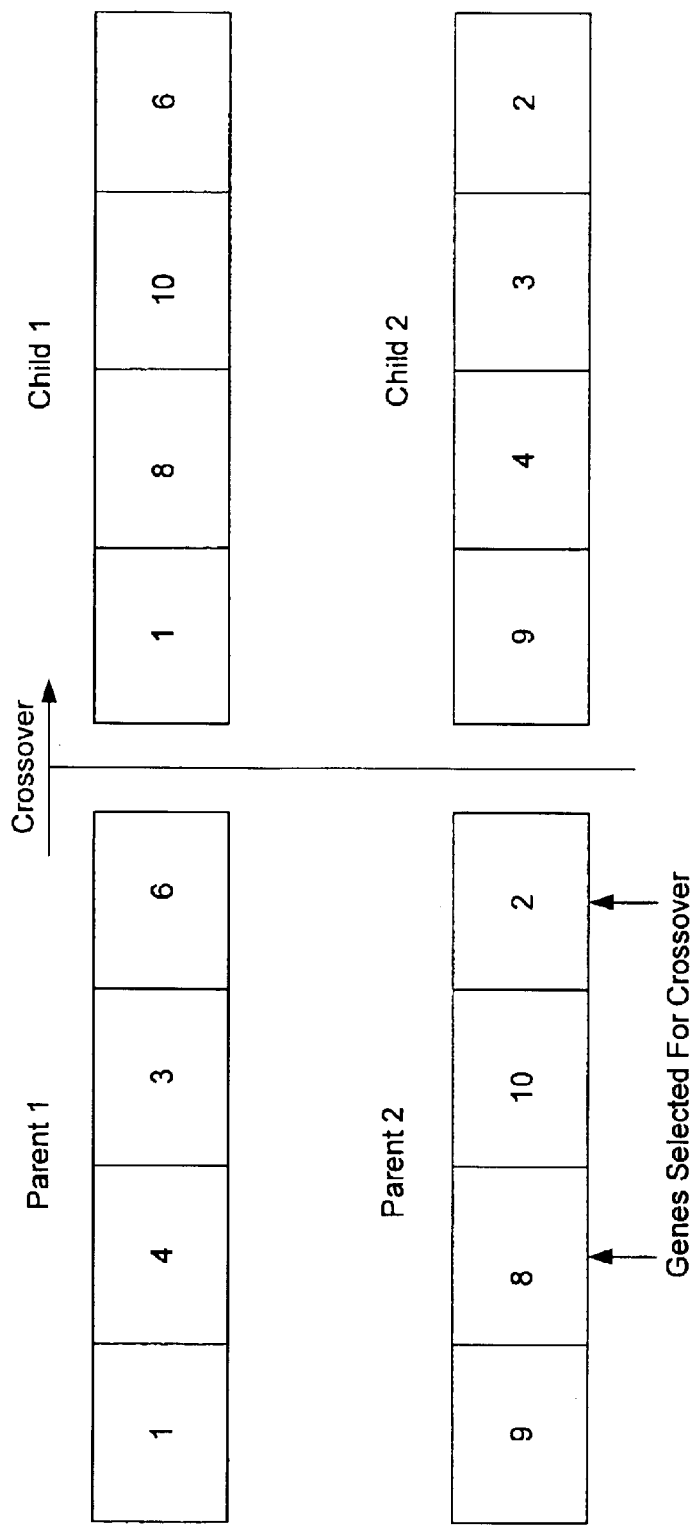
FIG. 11 is a schematic representation of use of uniform crossover to create child strings.

Crossover: The crossover operator takes genes from each of the parent string and combines them to create child strings. A uniform crossover scheme can then be used for creating child strings. FIG. 11 shows how uniform crossover is performed to produce the child strings. Each gene of the parent strings is chosen with certain probability and are swapped to yield the two child strings.

Mutation: After the child strings are created, the genes of the child strings can undergo mutation. For mutation, a gene is selected with a certain probability (mutation probability) and is replaced with a random number within the allowed range.

Fitness evaluation: One measurement in a particular segment of the PWL transient waveform is suade. Hence, the total number of measurements is equal to the string length N. The fitness is equal to the sum of absolute value of the sensitivities of the measurements to the process parameters for the critical circuit instances.

EXAMPLE 1

Table 1 provides the performance specifications of an operational amplifier. In the absence of real data from the silicon foundry, it is assumed that the specification failure in this operational amplifier is caused by variations in seven parameters namely, the threshold voltages ($V_{ton}$, $V_{top}$), gate oxide thickness ($T_{OX}$) aspect ratios (($W/L)_n$, $(W/L)_p$), bias resistance ($R_{bias}$) and compensating capacitor (CC). For the purpose of this example, it is assumed that the test measurement hardware has the capability of measuring small signal voltage gain of the operational amplifier for fault detection with 0.1% accuracy.

TABLE 1

Specifications of the Compensated Operational Amplifier

| Performance Parameter | Specification | Number of Measurements |
|---|---|---|
| Bias current | <2 mA | 11 |
| $F_{-3}$ dB frequency | >37 KHz | 2 |
| DC gain | >49 dB | 1 |
| Phase margin | >82° | 1 |
| Gain margin | >23 dB | 3 |

First, the training set for building the synthesizing function for each of the specification was generated using the algorithm FindTrainSet( ). The voltage gain at a set of 25 equally spaced frequency points on a logarithmic scale between DC and 150 MHz were chosen for fault detection. Next, the 25 measurements were ordered using OrderMeasurements( ) and a subset of these measurements were chosen for deriving the synthesizing functions using SelectMeasurements( ). The number of measurements needed to derive each of the synthesized measurements are given in Table 1. Thus, the synthesized measurement for bias current was derived from 11 measurements and that for the $f_{-3}$ dB frequency was derived from 2 measurements, and so on. Totally, 15 measurements are needed to derive all the synthesizing functions indicating that some measurements are used to derive more than one synthesizing functions.

The value of $\delta_1$ was determined for each of the synthesized measurements. The bound $3\delta_i$ and the specification bound constitutes the test criterion for the optimized tests. To evaluate the generated tests, 1000 Monte Carlo samples were generated (assuming independent normal distributions with 10% tolerance for parameters) of the operational amplifier and marked as faulty or fault free using the conventional specification tests. The fifteen selected measurements were made on these circuit instances and random measurement errors were injected to incorporate measurement non-idealities. Using these measurements with measurement errors incorporated, five synthesized measurements were derived (one corresponding to each of the circuit specification) using the precomputed synthesizing functions. Using the derived test criteria and the test flow given in FIG. 6, the circuits were classified into three categories. Table 2 summarizes the simulation results.

Out of 1000 circuits, 776 were found to satisfy the specification on bias current. Using the synthesized measurements 744 of these circuits were classified with a high degree of certainty. Out of the remaining 32 circuits, 17 had an uncertain test outcome. Hence for these 17 circuits, bias current is a critical performance parameter. Similarly, 20 circuit instances (out of 224) those did not satisfy the specification on the bias current have bias current as a critical performance parameter.

When all the specifications are considered, the synthesized measurements are able to correctly classify 93% of the CUTs. Out of the remaining 7%, 4.5% had an uncertain test outcome stet. These circuits are then subjected to the critical specification tests for fault detection. Thus only remaining 2.5% of the CUTs are misclassified by the proposed test procedure.

It is to be noted that not all the 44 circuits with uncertain test outcome were subjected to all the specification tests. From the table it can be seen that bias currents of 37, $f_{-3}$ dB of five, phase margin of one and gain margin of 48 circuits are to be measured. Thus, in worst case, only 91 performance parameters must be measured to correctly classify 97.5% of the CUTS.

EXAMPLE 2

Now the simulation results on an ITC'97 bench mark circuit, state-variable filter will be discussed. The faults in the state-variable filter were assumed to be due to variations in 16 parameters, seven of them are the process parameters of the operational amplifier and the remaining nine are the values of passive components of the state variable filter. For the state-variable filter, two double-ended specifications and one single ended specification were considered. The performance parameters and the specifications are given in Table 3.

TABLE 3

Specification of the State-Variable Filter

| Performance Parameter | Specifications | Number of Measurements |
|---|---|---|
| Center Frequency of the Band-Pass Filter ($f_c$) | >750 Hz <850 Hz | 1 4 |
| Maximum gain (K) | >1.0 <1.2 | 3 1 |
| Q-factor (Q) | >1.0 | 11 |

To test this circuit, transient tests were generated using the methods described herein. To generate a training set for test

TABLE 2

Simulation Results on the Compensated Operational Amplifier

| | | Good Circuits | | | Bad Circuits | | |
|---|---|---|---|---|---|---|---|
| Performance Parameters | Total | Declared as good | Needs Further Testing | Mis-classified | Total | Declared as Bad | Needs further Testing | Mis-classified |
| Bias Current | 776 | 744 | 17 | 15 | 224 | 183 | 20 | 21 |
| $F_{-3}$ dB frequency | 783 | 780 | 3 | 0 | 217 | 213 | 2 | 2 |
| DC gain | 849 | 849 | 0 | 0 | 151 | 151 | 0 | 0 |
| Phase margin | 999 | 998 | 1 | 0 | 1 | 0 | 0 | 1 |
| Gain margin | 894 | 11 | 35 | 11 | 60 | 42 | 13 | 5 |
| All | 447 | 419 | 20 | 8 | 553 | 509 | 24 | 20 | generation, the two double-ended specifications were decomposed to single-ended specifications to give a total of five single-ended specifications. Circuit instances were generated for each of the five single-ended specifications using GenerateTrainSet( ), and five circuits (one corresponding to each of the single-ended specification) with minimum distance ($l_2$, norm) from the nominal circuit were selected for generating the optimum PWL input stimulus. To generate the optimum PWL input stimulus, a maximum testing time of 5 ms was assumed. For encoding the PWL input into the genetic string, a string of 20 genes (giving 20 PWL segments) was assumed and the voltage at the corner points of the PWL segments was quantized to 20 levels between −5V and 5V.

The output of the CUT was sampled at 20 equally spaced time points for fault detection. For each of the five single-ended specifications, these 20 measurements were ordered and a subset of measurements were chosen to derive the synthesizing functions. For measurement ordering and selection, a measurement error of 1% was assumed. The number of measurements required for each of the synthesizing functions is given in Table 3 along with the corresponding specifications.

The generated tests were evaluated as described for the operational amplifier using 1000 Monte Carlo samples of the state-variable filter assuming independent normal distribution for the process parameters with 10% tolerance. Table 4 summarizes the simulation results. When all the circuit specifications were considered, out of 824 good circuits, 83% were declared as good by the derived tests, 10% needed further testing, and 7% were misclassified. Out of 176 bad circuits, 72% were classified as bad by the test, 20% needed further testing, and 8% were misclassified. Thus, with 16 time domain measurements and a few (maximum 182) performance parameter measurements, 93% of the circuits were correctly classified in the presence of 1% measurement error (in transient measurements). This, as compared to a total of 3000 performance parameter measurements, reduces down the overall testing time of the state-variable filter. Notice that, for this example, a higher percentage error was assumed for the measurements as compared to the operational amplifier example. That is why a 7% misclassification is obtained as compared to 2.6% in the previous example.

evaluating the circuit response to predict whether the performance parameters of the circuit satisfies predetermined specifications for the circuit; and making a pass/fail determination for the circuit based upon the evaluation of the circuit response.

2. The method of claim 1, wherein the low-cost optimized test is used to evaluate compliance with each specification specified for the circuit being tested.

3. The method of claim 1, wherein the low-cost optimized test is used to evaluate compliance with less than each specification specified for the circuit being tested.

4. The method of claim 1, wherein the low-cost optimized test is designed to maximize the sensitivity of the circuit response to changes in circuit process parameters by deriving synthesizing functions which map measurement responses of the circuit to the circuit performance parameters.

5. The method of claim 1, further comprising performing specification based tests to circuits for which a clear pass/fail determination could not be made from the low-cost optimized test.

6. The method of claim 5, wherein the specification based tests are applied to determine compliance with respect to less than all of the predetermined specifications for the circuit being tested.

7. The method of claim 5, wherein the optimized test is created to minimize a variance, $\sigma^2_{ei}$, such that the number of specification based tests needed is minimized.

8. The method of claim 1, further comprising performing specification based tests to the circuits to determine compliance with one or more predetermined circuit specifications.

9. The method of claim 8, wherein the specification based tests are applied to less than all of the predetermined circuit specifications specified for the circuit being tested.

10. The method of claim 1, wherein the low-cost optimized test is formulated by deriving synthesizing functions which map a measurement response to circuit performance parameters.

11. The method of claim 10, wherein one synthesizing function is derived for each circuit specification to be tested.

TABLE 4

| | Good Circuits | | | | Bad Circuits | | |
|---|---|---|---|---|---|---|---|
| Specifications | Total | Declared as good | Needs Further Testing | Mis-classified | Total | Declared as Bad | Needs further Testing | Mis-classified |
| $F_c > 750$ Hz | 930 | 868 | 36 | 26 | 70 | 50 | 13 | 7 |
| $F_c < 850$ Hz | 945 | 919 | 14 | 12 | 55 | 45 | 8 | 2 |
| K > 1.0 | 993 | 992 | 0 | 1 | 7 | 1 | 5 | 1 |
| K < 1.2 | 964 | 891 | 49 | 24 | 36 | 24 | 6 | 6 |
| Q > 1.0 | 964 | 891 | 49 | 24 | 36 | 24 | 2 | 7 |
| All | 824 | 687 | 80 | 57 | 176 | 126 | 35 | 15 |

While particular embodiments of the invention have been disclosed in detail in the foregoing description and drawings for purposes of example, it will be understood by those skilled in the art that variations and modifications thereof can be made without departing from the spirit and scope of the invention as set forth in the following claims.

What is claimed is:

1. A method for testing circuits having analog components, comprising:

performing a low-cost optimized test on the circuit by applying an optimized input stimulus to the circuit, the circuit having analog components;

capturing the circuit response to the input stimulus applied to the circuit;

12. The method of claim 10, wherein the circuit response is input into the synthesizing functions to predict compliance with the predetermined specifications.

13. The method of claim 10, wherein the synthesizing functions are derived near the boundary of an acceptance boundary for each circuit performance parameter.

14. The method of claim 10, wherein the synthesizing functions are derived through nonlinear regression.

15. The method of claim 1, wherein the input stimulus is a sinusoidal stimulus.

16. The method of claim 1, wherein the input stimulus is derived using genetic algorithms.

\* \* \* \* \*

UNITED STATES PATENT AND TRADEMARK OFFICE
CERTIFICATE OF CORRECTION

PATENT NO. : 6,865,500 B1
DATED : March 8, 2005
INVENTOR(S) : Variyam et al.

It is certified that error appears in the above-identified patent and that said Letters Patent is hereby corrected as shown below:

<u>Title page,</u>
Item [75], Inventors, second inventor should read -- Abhijit Chatterjee, Marietta, GA (US) --

Signed and Sealed this

Seventh Day of June, 2005

JON W. DUDAS
*Director of the United States Patent and Trademark Office*